United States Patent
Subramanian et al.

(10) Patent No.: US 6,294,460 B1
(45) Date of Patent: Sep. 25, 2001

(54) SEMICONDUCTOR MANUFACTURING METHOD USING A HIGH EXTINCTION COEFFICIENT DIELECTRIC PHOTOMASK

(75) Inventors: Ramkumar Subramanian, San Jose; Minh Van Ngo, Fremont; Suzette K. Pangrle, Cupertino; Kashmir Sahota, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/586,254

(22) Filed: May 31, 2000

(51) Int. Cl.$^7$ ............................................. H01L 21/4763
(52) U.S. Cl. ..................... 438/636; 438/631; 438/633; 438/634; 438/952
(58) Field of Search ................................... 438/636, 637, 438/626, 631, 633, 634, 952

(56) References Cited

U.S. PATENT DOCUMENTS

| | | | |
|---|---|---|---|
| 5,733,712 | * 3/1998 | Tanaka et al. | 430/431 |
| 5,918,147 | * 6/1999 | Filipiak et al. | 438/636 |
| 6,004,850 | * 12/1999 | Lucas et al. | 438/301 |
| 6,008,120 | 12/1999 | Lee | 438/634 |
| 6,174,810 | * 1/2001 | Islam et al. | 438/687 |

* cited by examiner

Primary Examiner—Trung Dang
(74) Attorney, Agent, or Firm—Mikio Ishimaru

(57) ABSTRACT

A method is provided for manufacturing a semiconductor with fewer steps and minimized variation in the etching process by using SiON as a bottom antireflective (BARC) layer and hard mask in conjunction with a thin photoresist layer. In one embodiment, an etch-stop layer is deposited on a semiconductor substrate, a dielectric layer is deposited on top of the etch-stop layer, and a BARC is deposited on top of the dielectric layer. The BARC is deposited by PECVD to enrich the BARC with semiconductor material to increase the extinction coefficient of the BARC so its thickness can be reduced. A photoresist layer with a thickness less than the thickness of the BARC is then deposited on top of the BARC. The photoresist is then patterned, photolithographically processed, developed, and removed. The BARC is then etched away in the pattern developed on the photoresist and the photoresist is then removed. The BARC is then used as a mask for the etching of the dielectric layer. A conductive material is deposited over the BARC and the dielectric layer and is subsequently removed in the process of polishing the conductive material without requiring a separate BARC removal step.

14 Claims, 8 Drawing Sheets

SEMICONDUCTOR MANUFACTURING METHOD USING A HIGH EXTINCTION COEFFICIENT DIELECTRIC PHOTOMASK

CROSS-REFERENCE TO RELATED APPLICATION(S)

The present application contains subject matter related to a concurrently filed U.S. Patent Application by Ramkumar Subramanian, Wenge Yang, Marina V. Plat, and Lewis Shen entitled "SEMICONDUCTOR MANUFACTURING METHOD USING A DIELECTRIC PHOTOMASK". The related application is assigned to Advanced Micro Devices, Inc and is identified by Ser. No. 09/586,556.

The present application also contains subject matter related to a concurrently filed U.S. Patent Application by Ramkumar Subramanian, Minh Van Ngo, Suzette K. Pangrle, Kashmir S. Sahota, and Christopher F. Lyons entitled "METHOD FOR CREATING PARTIALLY UV TRANSPARENT ANTI-REFLECTIVE COATING FOR SEMICONDUCTORS". The related application is assigned to Advanced Micro Devices, Inc and is identified by Ser. No. 09/588,119.

The present application also contains subject matter related to a concurrently filed U.S. Patent Application by Ramkumar Subramanian, Minh Van Ngo, Kashmir S. Sahoto, YongZhong Hu, Hiroyuki Kinshita, Fei Wang and Wenge Yang entitled "METHOD FOR USING A LOW DIELECTRIC CONSTANT LAYER AS A SEMICONDUCTOR ANTI-REFLECTIVE COATING". The related application is assigned to Advanced Micro Devices, Inc and is identified by Ser. No. 09/586,264.

The present application also contains subject matter related to a concurrently filed U.S. Patent Application by Kashmir S. Sahota, YongZhong Hu, Hiroyuki Kinoshita, Minh Van Ngo, Ramkumar Subramanian, Fei Wang, and Wenge Yang entitled "METHOD FOR ELIMINATING ANTI-REFLECTIVE COATING FOR SEMICONDUCTORS". The related application is assigned to Advanced Micro Devices, Inc and is identified by Ser. No. 09/588,117.

TECHNICAL FIELD

The present invention relates generally to manufacturing semiconductors and more particularly to patterning semiconductors using masks.

BACKGROUND ART

Flash electrically erasable programmable read only memories (Flash EEPROMs) are a class of nonvolatile memory devices that are programmed by hot electron injection and erased by Fowler-Nordheim tunneling.

In the first step of putting such electrical devices on a semiconductor, each memory cell is formed on a semiconductor substrate (i.e., a silicon die or chip), having a heavily doped drain region and a source region embedded therein. The source region further contains a lightly doped deeply diffused region and a more heavily doped shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric or tunnel oxide layer formed on the surface of substrate overlying the channel region; a polysilicon floating gate overlying the tunnel oxide; an interpoly dielectric layer overlying the floating gate; and a polysilicon control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

After the formation of the memory cells, electrical connections, a second step of forming what is commonly known as "contacts" must occur to connect the stack gated structure, the source region and the drain regions to other part of the chip. The contact process starts with the formation of sidewall spacers around the stacked gate structures of each memory cell. An etch-stop layer, typically a nitride material such silicon nitride, is then formed over the entire substrate, including the stacked gate structure, using conventional techniques, such as chemical vapor deposition (CVD). A dielectric layer, generally of oxide, is then deposited over the nitride layer. A layer of photoresist is then placed over the dielectric layer and is photolithographically patterned, exposed, and developed ("processed") to form the pattern of contact openings. An anisotropic etch is then used to etch out portions of the dielectric layer to form source and drain contact openings. The contact openings stop at the source and drain regions in the substrate. The photoresist is then stripped, and a conductive material, such as tungsten, is deposited over the dielectric layer and fills the source and drain contact openings to form so-called "self-aligned contacts" (conductive contacts). The substrate is then subjected to a chemical-mechanical polishing (CMP) process, which removes the conductive material above the dielectric layer to form the conductive contacts through a contact CMP process.

Subsequent steps involving a "damascene" process are used to form local interconnects between the various conductive contacts. An etch-stop layer is formed over the CMP processed surface and a layer of photoresist is then placed over the etch-stop layer and is photolithographically processed to form the pattern of contact openings. Next, a dielectric layer, generally of oxide, is then deposited and a layer of photoresist is then placed over the dielectric layer and is photolithographically processed to form the pattern of first level local interconnect channel openings. An anisotropic etch is then used to etch out portions of the dielectric layer to form the channel openings. The channel openings stop at the etch-stop layer except at the contact openings. The photoresist is then stripped, and a conductive material, such as aluminum or copper, is deposited over the dielectric layer and fills the channel openings. A CMP process removes the conductive material above the dielectric layer to form the local interconnects, or "wires".

Additional levels of local interconnect and vias connecting the additional levels of local interconnect are formed in "dual damascene" processes which are substantially the same as described above with the exception that certain etching steps and conductive material filling steps are combined.

The use of photolithography and photoresist is common to each of these various processes. As semiconductor devices have shrunk in size, the industry has turned towards deep ultraviolet (DUV) lithography as a photolithographic exposure process to pattern openings in sub-0.35 micron line geometry semiconductor devices.

A major obstacle to the miniaturization of semiconductors is the effect of reflectivity in the DUV lithographic and conventional i-line lithographic processes. Reflections occur at the junctions of materials and are influenced in part by the thickness of materials. Because the precision of the photolithographic process is sensitive to such reflections, reducing the reflections by lowering the reflectivity of materials with good control across wafers and within wafers to under about 15% is essential. In particular, the differences in thickness caused by the polysilicon, metal, and poly/metal stacks has made small feature patterning and critical dimension (CD) control of photoresist very difficult. Such topography causes unpredictable swings in material reflectivity and needs to be reduced or dampened in some way in order to reduce semiconductor device size. Non-uniformities occurring when the dielectric layer undergoes CMP can increase the total reflectivity from the dielectric to the photoresist during photolithography and cause further disruptions in patterning.

To solve the problem posed by reflectivity, different anti-reflective coatings (ARCs) have been developed which work by phase shift cancellation of specific wavelengths to provide uniform photoresist patterning. These ARCs are specifically designed so that the reflective light from the photoresist/ARC interface is equal in amplitude but opposite in phase to the light reflected from the ARC/reflective layer interface.

It has been found that there are certain line width variations which are due to the ARC not being able to reduce the reflective layer reflectivity to a minimum. The reflectivity causes problems with the photoresist which have been corrected in part by the use of bottom anti-reflective coatings (BARCs) under the photoresists.

Silicon oxynitride (SiON) by itself has been found to be a good BARC material. In essence, the silicon oxynitride BARC serves two functions during semiconductor memory manufacturing: (1) as a hard mask during self-aligned etch (SAE) and during self-aligned-source etch; and (2) as a bottom anti-reflective layer for photolithography at second gate masking.

However, the variations in small feature patterning and CD control have not been eliminated through the use of a SiON BARC.

It appears that during the etching process to etch the SiON not covered by photoresist, variations in the photoresist prevent full etching from occurring and the resulting variation in the SiON is greater than the variation in the photoresist. When subsequent etching occurs with the SiON used as a mask layer, these variations are once again passed down and magnified.

One solution involved compensating for the problem and insuring that the size of the openings at the bottom of the etched region was the correct size. This was accomplished by over-sizing the size of the photolithographic pattern openings. Unfortunately, this results in larger feature sizes, and therefore slower and less efficient semiconductor devices.

In addition, the presence of a BARC typically requires a removal step after it has served its purpose. Because each additional step greatly increases the complexity and speed with which a semiconductor device can be created, the use of a BARC has significant disadvantages.

A method of minimizing the variation in the etching process to allow for smaller semiconductor devices without increasing the number of production steps has long been sought, but has eluded those skilled in the art.

DISCLOSURE OF THE INVENTION

The present invention provides a method of manufacturing a semiconductor with minimized variation in the etching process by using SiON as a bottom antireflective (BARC) layer and hard mask in conjunction with a thin photoresist layer.

The present invention further provides a method of manufacturing a semiconductor with minimized variation in the etching process. Patterning is improved by the use of SiON as a BARC. The thin photoresist layer allows for less variation in the photolithographic process. As a result, there is significantly less variation in the SiON and in turn, there is significantly less variation in later layers in which SiON is used as a hard mask.

The present invention further provides a method of manufacturing a semiconductor without a separate step for BARC removal. After photolithography, a pattern is etched into the BARC. The BARC is then used as a hard mask making the photoresist unnecessary. By the same token, when the dielectric layer is etched, the BARC is no longer required as a hard mask. Because of the thinness of the photoresist, both the photoresist and the BARC layer are removed as by-products of subsequent etching steps once they are no longer required, therefore eliminating the need for a separate step to remove the remaining BARC material. If the BARC material is not removed during the etching steps, it can be removed during the chemical-mechanical polishing process.

The present invention further provides a method of manufacturing a semiconductor with minimized variation in the etching process and without a separate step for BARC removal. An etch-stop layer is deposited on a semiconductor substrate, a dielectric layer is deposited on top of the etch-stop layer, a BARC is deposed on top of the dielectric layer, and a photoresist layer with a thickness less than the thickness of the dielectric layer is then deposited on top of the BARC. The photoresist is then patterned, photolithographically processed, and developed. The BARC is then etched into the pattern developed on the photoresist. The etched BARC is then used as a hard mask for the patterned etching of the dielectric layer. As a by-product of this etch, the photoresist is removed. The dielectric layer is then used as a mask for the etching of the etch-stop layer. As a by-product of this etch, the BARC is removed.

The present invention further provides a method of manufacturing a semiconductor with minimized variation in the etching process and without a separate step for BARC removal. A nitride etch-stop layer is deposited on a silicon substrate, a layer of silicon oxide is deposited on top of the nitride etch-stop layer, a silicon oxynitride layer is deposited on top of the silicon oxide layer, and a photoresist layer with a thickness less than the thickness of the silicon oxide layer is then deposited on top of the silicon oxynitride layer. The photoresist is then patterned, photolithographically processed, and developed. The silicon oxynitride layer is then etched into the pattern developed on the photoresist. The etched silicon oxynitride layer is then used as a hard mask for the patterned etching of the silicon oxide layer. As a by-product of this etch, the photoresist is removed. The silicon oxide layer is then used as a mask for the etching of the nitride etch-stop layer. As a by-product of this etch or a subsequent chemical-mechanical polish, the silicon oxynitride layer is removed.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
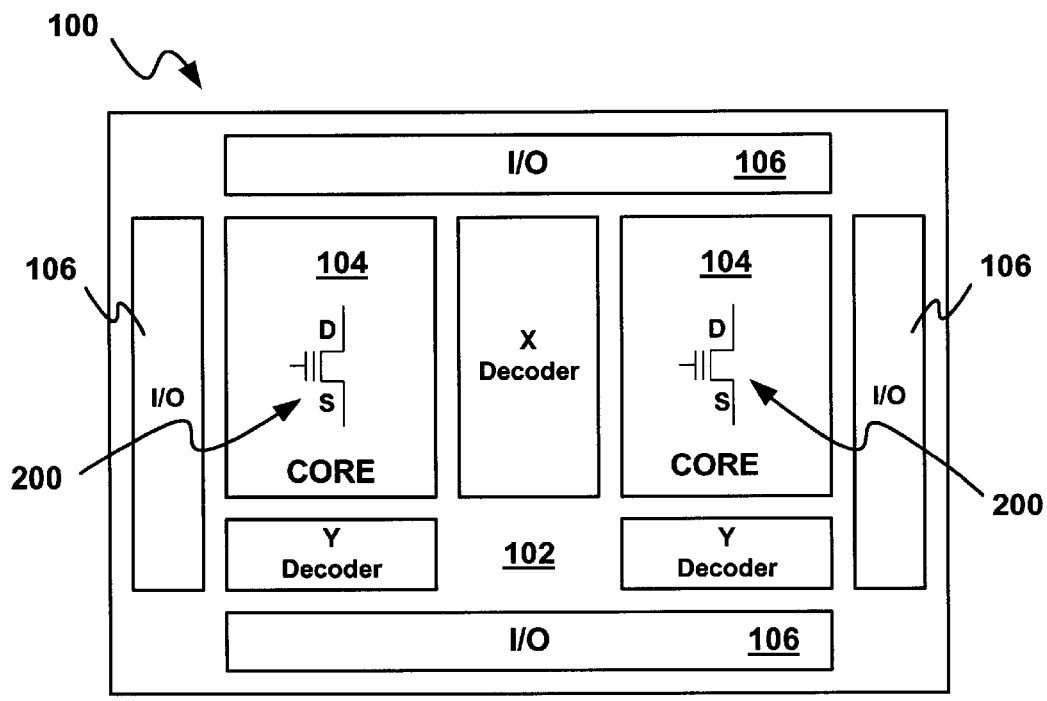
FIG. 1 (PRIOR ART) is a plan view of a conventional memory device.

Referring now to FIG. 1 (PRIOR ART), therein is shown a plan view of a conventional memory device, a Flash EEPROM 100 which commonly includes a silicon semiconductor substrate 102 in which one or more high-density core regions and one or more low-density peripheral portions are formed. High-density core regions typically include one or more M×N array cores 104 of individually addressable, substantially identical memory cells 200. Low-density peripheral portions 106 typically include input/output (I/O) circuitry and circuitry for selectively addressing the individual memory cells. The selective addressing circuitry typically includes one or more x-decoders and y-decoders, cooperating with the I/O circuitry for connecting the source, gate, and drain of selected addressed memory cells to predetermined voltages or impedances, to effect designated operations on the memory cell, e.g., programming, reading and erasing, and deriving necessary voltages to effect such operations.

Figure 2A:
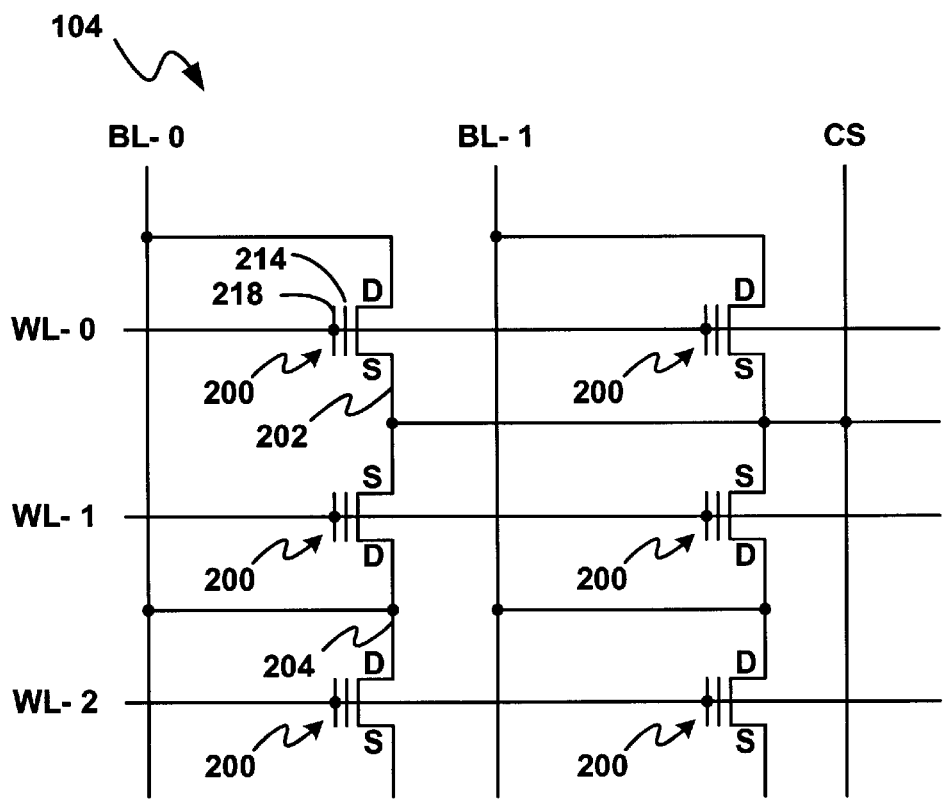
FIG. 2A (PRIOR ART) is schematic diagram of a portion of a memory cell array.
Figure 2B:
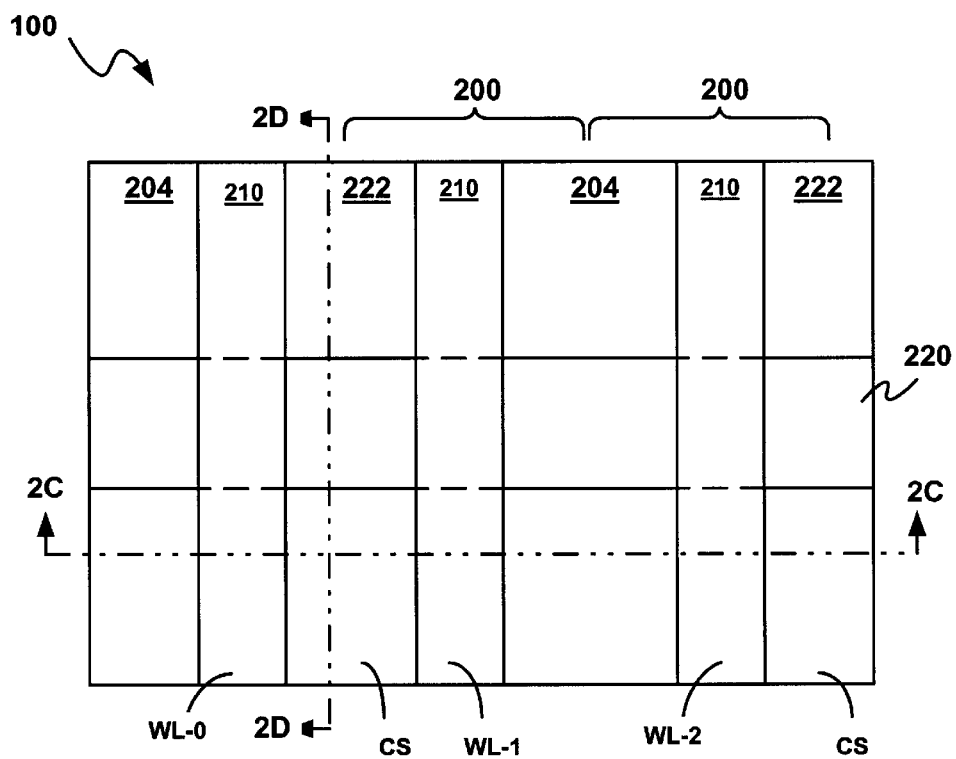
FIG. 2B (PRIOR ART) is a plan view of a portion of an intermediate state (partially complete) of a memory cell array core.
Figure 2C:
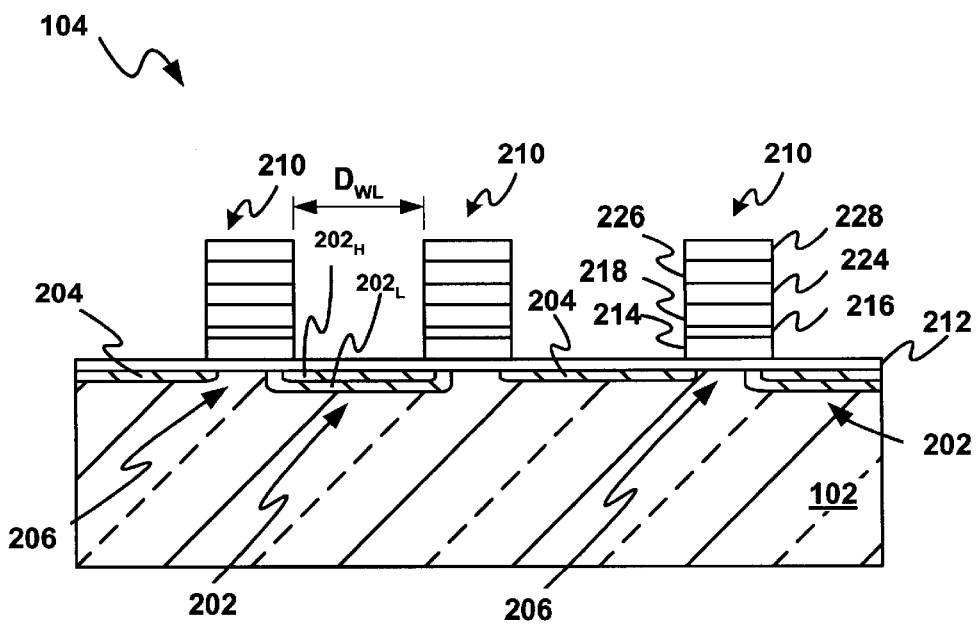
FIG. 2C (PRIOR ART) is a simplified cross section of FIG. 2B (PRIOR ART) along line 2C—2C.

Referring now to FIG. 2A (PRIOR ART), therein is shown a schematic diagram of a portion of a memory cell array in which each memory cell 200 in array core 104 typically comprises a source 202, a drain 204, and a channel 206 (shown in FIG. 2C (PRIOR ART)).

Referring now to FIG. 2B (PRIOR ART), therein is shown a plan view of a portion of an intermediate state (partially complete) of a memory cell array core 104.

Referring now to FIG. 2C (PRIOR ART), therein is shown a simplified cross section of FIG. 2B (PRIOR ART) along line 2C—2C. The source 202, drain 204, and channel 206 semiconductor regions are shown formed in semiconductor substrate 102 (or in an isolation well) and multi-layer structures, commonly referred to as "stacked gate" (word line) structures 210. The stacked gate structures 210 include: a thin gate dielectric layer 212 (commonly referred to as the "tunnel oxide") formed on the surface of substrate 102 overlying the channel 206, a floating gate 214 overlying the gate dielectric layer 212, an interpoly (inter-gate) dielectric layer 216 overlying the floating gate 214, and a control gate 218 overlying the interpoly dielectric layer 216. Additional layers, such as a silicide layer 224 (disposed on the control gate 218), a poly cap layer 226 (disposed on the silicide layer 224), and a SiON layer 228 (disposed on the poly cap layer 226) may be formed over the control gate 218. The memory cells 200 are arranged in a series of rows and columns.

In the completed array, the control gates 218 of the memory cells 200 in a row are formed integral to a common word line (WL) associated with the row. Columns of memory cells are arranged such that adjacent memory cells in a column share a common semiconductor region as a source or drain region. The source 202 of each memory cell in a column (except end memory cells) is formed in a common region with one of the adjacent memory cells, e.g., the preceding memory cell in the column. Likewise, the drain of the memory cell is formed in a common region with the drain 204 of the other adjacent memory cell, e.g., the next succeeding memory cell in the column (except end memory cells). The drain 204 of each memory cell in a column of memory cells is connected by a conductive bit line (BL) (FIG. 2A (PRIOR ART)), including an overlying layer of metal connected to each drain 204 of the memory cells 200 within the column. Additionally, the sources 202 of each memory cell 200 in a row (and hence pairs of rows) are interconnected by a common source line CS (FIGS. 2A (PRIOR ART)), which are formed in the substrate 102, as will be described. Any particular memory cell 200 within the array cores 104 can be individually addressed (programmed and read) by operating upon one word line and one bit line.

Typically, in forming an EEPROM 100, a pattern of field oxide regions 220 (FIG. 2B (PRIOR ART)) is initially formed to provide electrical isolation between the respective devices of EEPROM 100. For example, field oxide regions 220 are used to provide isolation between the array cores 104 and the devices of peripheral portions 106, as well as between the various columns of memory cells 200 within the array cores 104. Field oxide regions 220 are conventionally formed using a mask and selective growth process: a layer of thermal oxide ("barrier oxide" or "pad oxide") is grown or deposited over the surface of the substrate 102; a mask, frequently composed of nitride, is deposited on the barrier oxide, and patterned to cover those regions of the substrate 102 in which devices are to be formed (herein referred to as active regions); field oxide is grown in the exposed areas of the barrier oxide, by for example, the local oxidation of silicon (LOCOS); and the masking layer and barrier oxide are stripped to expose the underlying substrate 102. In general, referring to FIG. 2B (PRIOR ART), within the array cores 104, the selective growth process results in alternating parallel strips of field oxide regions 220 and exposed regions corresponding to the columns of memory cells 200 in the array.

The stacked gate (word line) structures 210 are then typically formed. For example, gate dielectric layer 212, comprising a thin (e.g. approximately 100 A) layer of oxide, is initially formed on the substrate 102 by a technique, such as thermal oxidation of the surface of the substrate 102 or by depositing a suitable material on the substrate 102. A layer of conductive polysilicon (e.g., polycrystalline silicon), that will ultimately form the floating gates 214, is typically then formed on the gate dielectric layer 212. For example, conductive polysilicon may be deposited by a number of different techniques, e.g., furnace-grown polysilicon. The polysilicon layer is typically then masked and etched to remove strips overlying the field oxide regions 220, leaving isolated strips of polysilicon on top of the gate dielectric layer 212 overlying the substrate regions corresponding to the columns of memory cells 200 of the array core 104 (i.e. the regions in which source, channel, and drain regions of memory cells in the column will be formed). A layer of dielectric material, such as, e.g., an oxide-nitride-oxide (ONO) layer, that will ultimately form interpoly dielectric layer 216 is typically then formed by a suitable technique.

For example, where the interpoly dielectric layer 216 is ONO, it is formed by growing a layer of oxide, depositing a layer of nitride, followed by growing another layer of oxide. The interpoly dielectric layer 216, in the completed array, insulates control gates 218 from floating gates 214 in the individual memory cells and electrically isolates the adjacent columns of the floating gates 214 in the array core 104. Another layer of conductive polysilicon (e.g., polycrystalline silicon), that will ultimately form the control gates 218 and the word lines WL connecting the control gates 218 of the memory cells in the respective rows of the array core 104, referred to as the control gate 218, is typically then thermally grown on the interpoly dielectric layer 216. Portions of the control gate 218 and the interpoly dielectric layer 216 are typically then selectively removed to define the stacked gate structures 210 on the gate dielectric layer 212, i.e., to form the floating gates 214, the interpoly dielectric layer 216, control gates 218 of the individual memory cells, and the word lines WL (portions of the interpoly dielectric layer 216 and control gate polysilicon layer bridge field oxide regions 220 to connect the respective memory cells of the rows of the core array). This is typically effected by masking and etching techniques.

When completed, this etch creates the generally parallel, stacked gate (word line) structures 210 separated by a distance $D_{WL}$, as shown in FIG. 2C (PRIOR ART). A silicide layer 224 is typically provided over the control gate 218 layer to reduce resistance. Thereafter, a polysilicon layer (commonly referred to as a "poly cap" layer) 226 is formed over the silicide layer 224 to serve as a cap layer for the stacked gate structures 210. Next, the SiON layer 228 may be formed over the poly cap layer 226. The combination of the poly cap layer 226 and the SiON layer 228 is commonly referred to as a "passivation layer". Thereafter, portions of the SiON layer 228 are partially removed using conventional masking and etching techniques to define the final stacked gate structures 210.

Conventionally, the portions of the field oxide regions 220 and the gate dielectric layer 212 between every second pair of adjacent stacked gate (word line) structures 210 in the array core 104 (i.e., the regions, generally indicated as 222, where the sources 202 are to be formed and the portions of the field oxide regions 220 disposed between sources 202 of the corresponding memory cells of adjacent columns) are then typically removed in preparation for formation of the common line CS (not shown) connecting the sources 202. This is typically effected using a conventional Self-Aligned Source (SAS) etch.

Figure 2D:
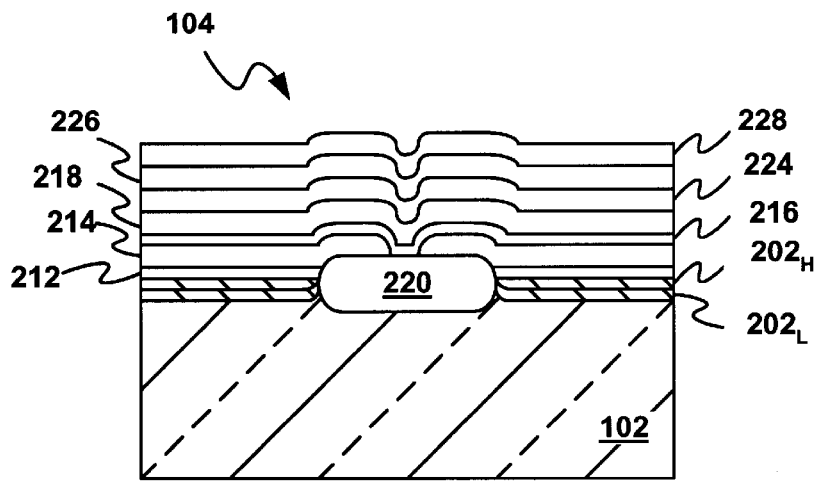
FIG. 2D (PRIOR ART) is a simplified cross section of FIG. 2B (PRIOR ART) along line 2D—2D.

Referring now to FIG. 2D (PRIOR ART), therein are shown the source 202, common line CS, and drain 204 regions formed in a conventional process. The source 202 and the common source line CS are typically formed by initially effecting a conventional double diffusion implant (DDI) with the SAS mask still in place. The DDI implants a first dopant (e.g. n-type, such as phosphorous) to form a deeply diffused, but lightly doped, N well $202_L$ establishing a graded source-channel junction as shown in FIG. 2D (PRIOR ART) which is a simplified cross section of FIG. 2B (PRIOR ART) along line 2D—2D. The SAS mask is then removed. The DDI implant is typically driven deeper into the substrate 102 by subjecting the substrate 102 to a thermal cycle at high temperature (e.g. 1050° Celsius). A shallow second implant, commonly referred to as a medium diffused drain (MDD) implant, is then performed (e.g., with arsenic) to create a more heavily doped, but shallower, n+ well $202_H$ embedded within deep N well $202_L$. The MDD implant also forms a shallow, abrupt drain 204.

Figure 3A:
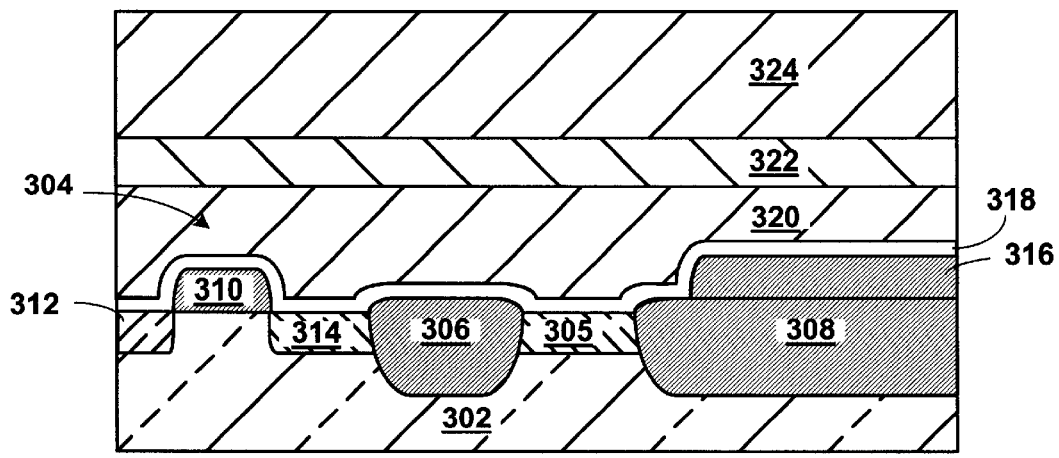
FIGS. 3A (PRIOR ART) through 3H (PRIOR ART) illustrate a partial sequence of process steps of a conventional process for forming an interconnect structure and its associate contact on a semiconductor substrate.

Referring now to FIG. 3A (PRIOR ART), therein is shown a cross-section of a simplified semiconductor 300 in an intermediate stage of processing. At this stage are shown a P-type doped semiconductor substrate 302 with a N-channel transistor 304, an active region 305, and shallow trench isolations (STI) 306 and 308. Included in the transistor 304 are a polysilicon gate 310, a source region 312, and a drain region 314. Another polysilicon gate 316 is shown disposed atop STI 308. The STI 306 electrically isolates N-channel transistor 304 and the active region 305. Similarly, the STI 308 electrically isolates the active region 305 and the polysilicon gate 316. In a typical process to form contacts and interconnect structures, a contact will be formed on the drain region 314, a Local Interconnect (LI) will be formed between the active region 305 and the polysilicon gate 316, and, although not shown, another contact will be formed on the LI. For purposes of illustration, transistor 304 and active region 305 represent elements of a logic device, while the polysilicon gate 316 represents an element of a memory device.

Also shown on the device are a nitride-based LI etch stop layer 318 deposited over the entire surface of the semiconductor substrate 302, a dielectric layer 320, such as an oxide, deposited over the etch-stop layer 318 and having subsequently undergone chemical-mechanical polishing (CMP) to planarize the surface, a bottom anti-reflective coating (BARC) 322 deposited over the surface of the dielectric layer 320 after planarization, and a photoresist layer 324 spun on top of the dielectric layer 320.

Figure 3B:
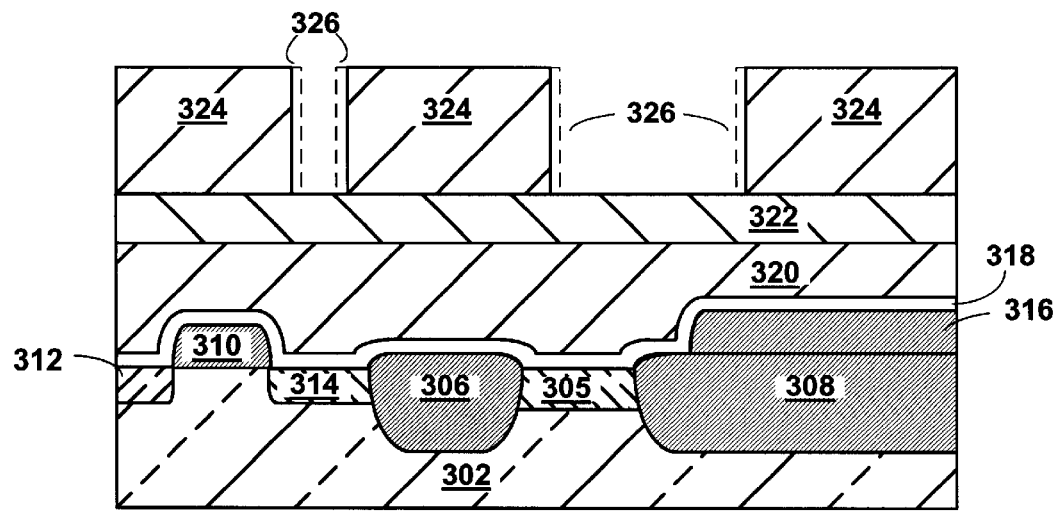

Referring now to FIG. 3B (PRIOR ART), therein is shown the patterning of the photoresist layer 324, which acts as an LI mask pattern. Due to the thickness of the photoresist layer 324, the photolithographic process produces variations 326 in the spaces in the photoresist pattern.

Figure 3C:
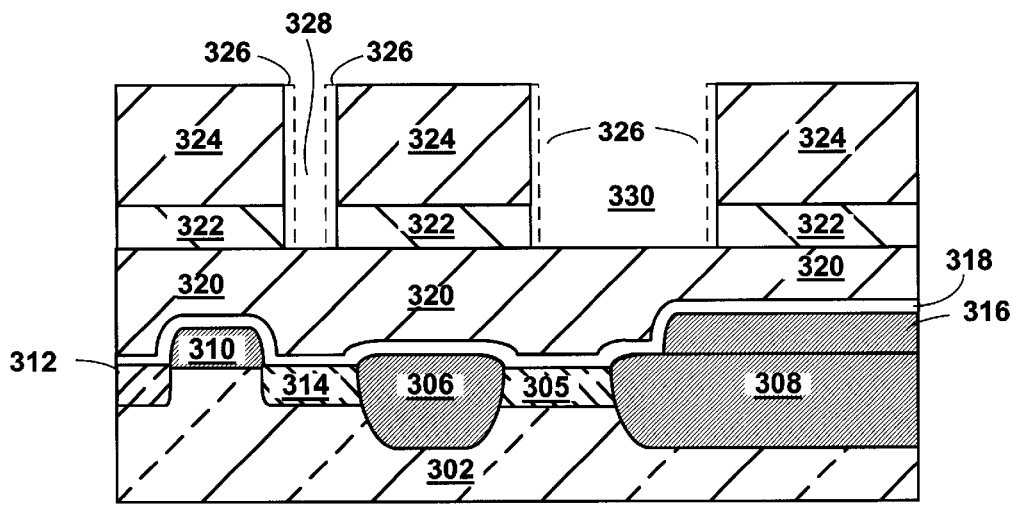

Referring now to FIG. 3C (PRIOR ART), therein is shown the etching of contact opening 328 and LI opening 330 in the BARC 322 following the LI mask pattern of photoresist layer 324. The BARC 322 now acts as a hard mask. The variations 326 in the photoresist layer 324 extend to the BARC 322 during the etching process.

Figure 3D:
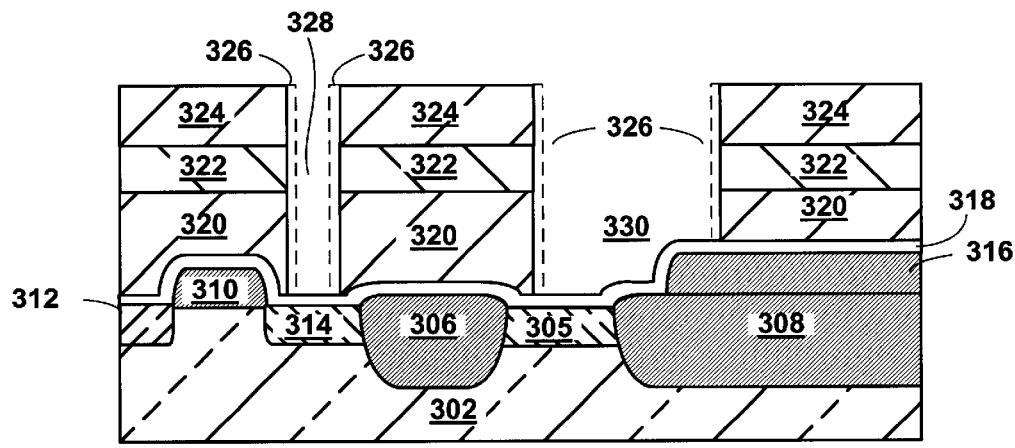

Referring now to FIG. 3D (PRIOR ART), therein is shown the deepening of the contact opening 328 and the LI opening 330 in the dielectric layer 320 by using the BARC 322 as a hard mask in conjunction with a conventional dielectric etch technique. The etchstop layer 318 stops the etching process. Part of the photoresist layer 324 is removed in the etching process. The variations 326 in the photoresist layer 324 and the BARC 322 extend to the dielectric layer 320 during the etching process.

Figure 3E:
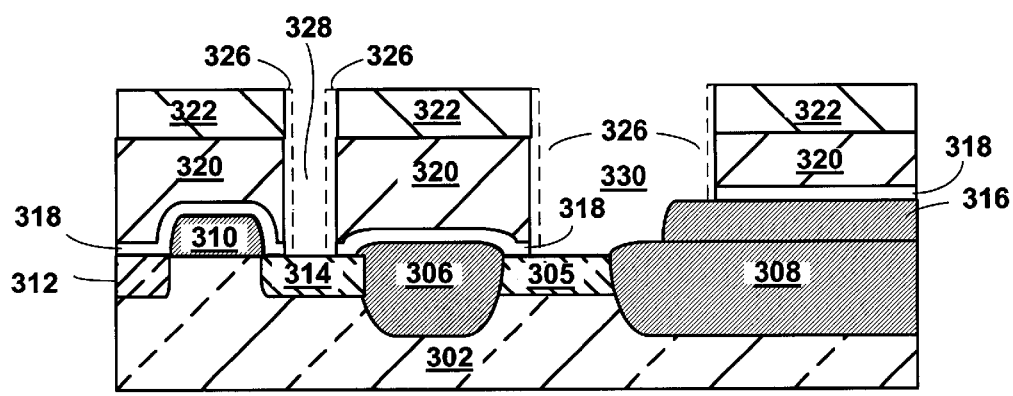

Referring now to FIG. 3E (PRIOR ART), therein is shown the deepening of the contact opening 328 and the LI opening 330 by removing the exposed etch-stop layer 318 using a conventional nitride etch technique. Most of the photoresist layer 324 is removed in this etching process. The variations 326 due to the thickness of the photoresist layer 324 extend to the etch-stop layer 318 during the etching process.

Figure 3F:
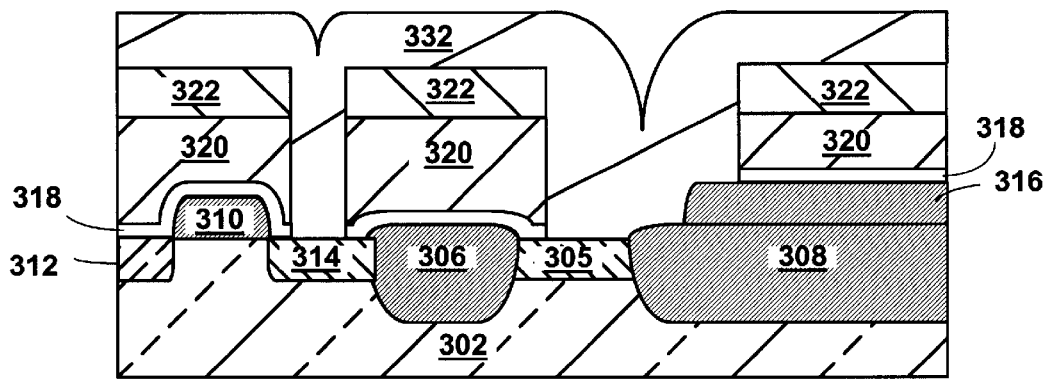

Referring now to FIG. 3F (PRIOR ART), therein is shown deposition of a conductive material 332, such as tungsten or aluminum although copper can also be used. The conductive material fills the contact opening 328 and the LI opening 330.

Figure 3G:
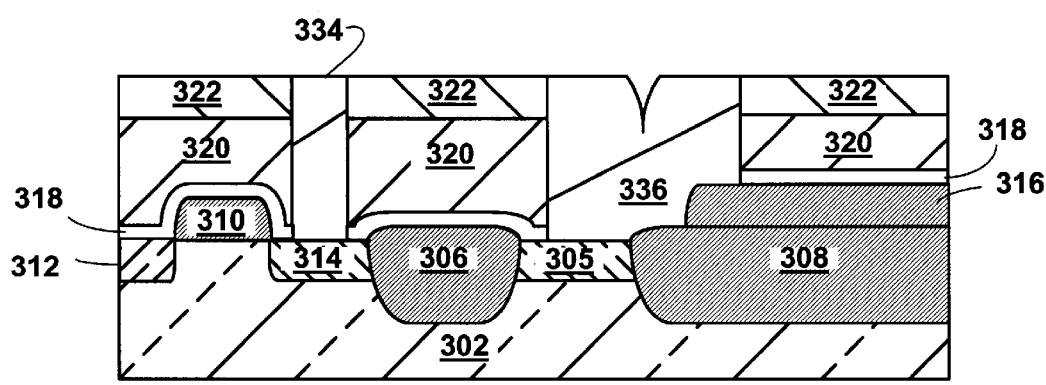

Referring now to FIG. 3G (PRIOR ART), therein is shown the structure of FIG. 3F (PRIOR ART) after CMP to form a contact 334 and a LI channel 336. While some of the BARC 322 is removed, if it is of SiON, it is time consuming to CMP large thicknesses.

Figure 3H:
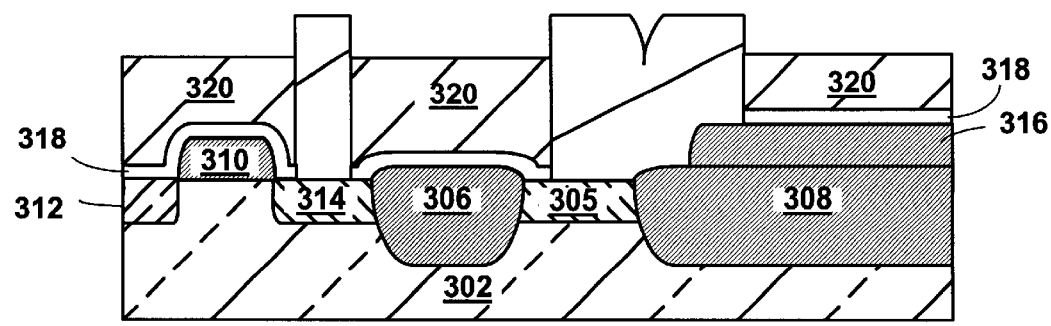

Referring now to FIG. 3H (PRIOR ART), therein is shown the removal of the BARC 322 in a separate etching step. Since the etching step is selective for the BARC 322, the conductive material of the contact 334 and LI channel 336 will extend above the dielectric layer 320, which is not etched.

Figure 4A:
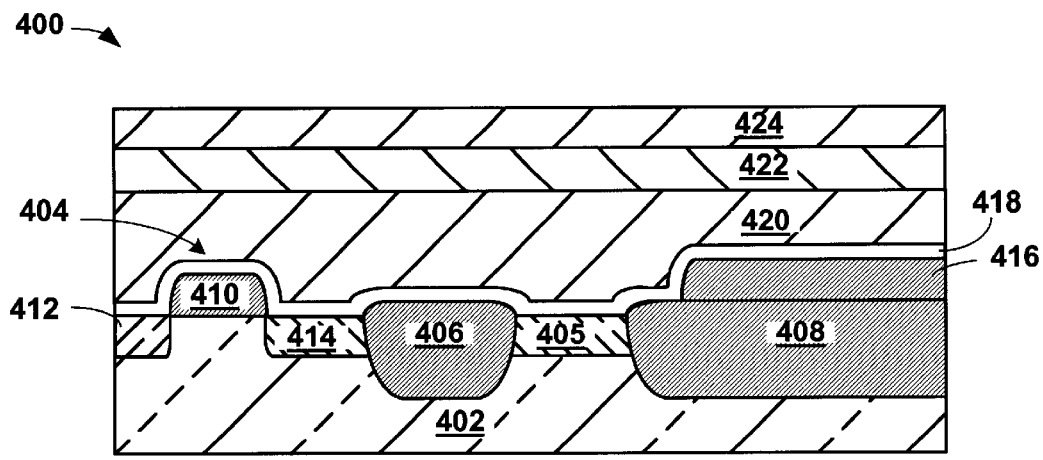
FIGS. 4A through 4G illustrate the sequence of process steps of a process in accordance with the present invention for forming an interconnect structure and its associate contact on a semiconductor substrate including the use of SiON as a bottom anti-reflective layer in conjunction with a thin photoresist layer.

Referring now to FIG. 4A, therein is shown a cross-section of a simplified semiconductor 400 in an intermediate stage of processing. At this stage, the semiconductor is identical to that of FIG. 3A (PRIOR ART) and depicts a P-type doped semiconductor substrate 402 with a N-channel transistor 404, an active region 405, and shallow trench isolations (STI) 406 and 408. Included in the transistor 404 are a polysilicon gate 410, a source region 412, and a drain region 414. Another polysilicon gate 416 is shown disposed atop STI 408. STI 406 electrically isolates N-channel transistor 404 and the active region 405. Similarly, STI 408 electrically isolates the active region 405 and the polysilicon gate 416. In a typical process to form contacts and interconnect structures, a contact will be formed on the drain region 414, a Local Interconnect (LI) will be formed between the active region 405 and the polysilicon gate 416, and, although not shown, another contact will be formed on the LI. For purposes of illustration, transistor 404 and active region 405 represent elements of a logic device, while polysilicon gate 416 represents an element of a memory device. The method of the present invention is not limited in scope to the example illustrated here and can apply to any semiconductor devices using similar processes.

Also shown on the device are a nitride-based LI etch stop layer 418 deposited over the entire surface of the semiconductor substrate 402, a dielectric layer 420, such as a silicon oxide, deposited over the etch-stop layer 418 and having subsequently undergone chemical-mechanical polishing (CMP) to planarize the surface, a bottom anti-reflective coating (BARC) 422 deposited over the surface of the planarized dielectric layer 420, and a thin photoresist layer 424 spun on top of the dielectric layer 420. The BARC 422 can be a silicon oxynitride (SiON), which is rich in silicon in order to increase its extinction coefficient over the conventional silicon oxynitride used in BARC, which is in the range of K=−0.4 to −0.5.

In the present invention, a plasma enhanced chemical vapor deposition (PECVD) process is used to deposit the SiON. In order to increase the silicon concentration in the SiON, as contrasted to a conventional PECVD process, the $SiH_4$ flow can be increased, the $N_2O$ flow decreased, the radio frequency power decreased, and/or the pressure decreased. The silicon is increased in order to increase the extinction coefficient to be what is defined as a "high" extinction coefficient of above K=−1.1, and preferably around K=−1.3, selected for the particular wavelength of light which is to be used during the photolithographic process applied to the thin photoresist layer 424. The extinction coefficient is too "high" when the SiON starts to reflect light.

By increasing the extinction coefficient, it is possible to reduce the thickness of the BARC while maintaining the same reflectivity. In the best mode, the SiON can be made less than 400 Å in thickness and be preferably in the 300 to 400 Å range.

Figure 4B:
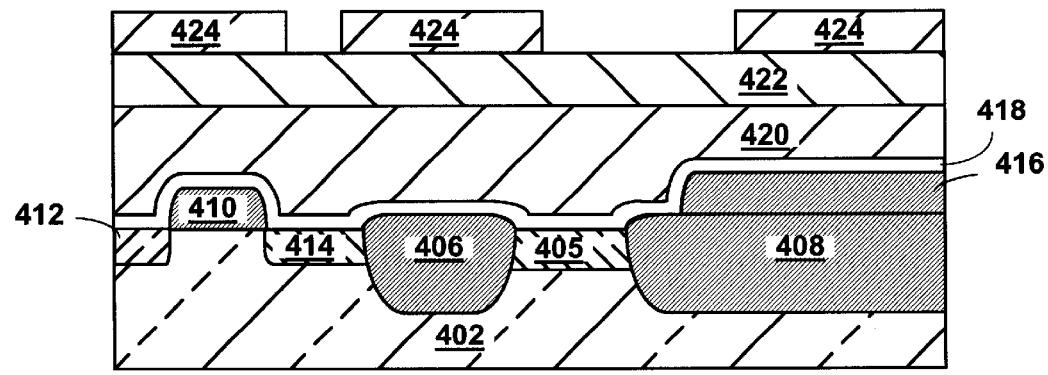

Referring now to FIG. 4B, therein is shown the thin photoresist layer 424 after undergoing photolithography and developing the thin photoresist layer 424 to form a contact and LI mask pattern. Due to the thinness of the thin photoresist layer 424, which is thinner than the BARC 422, any variation in the thin photoresist layer 424 will be minimized.

Figure 4C:
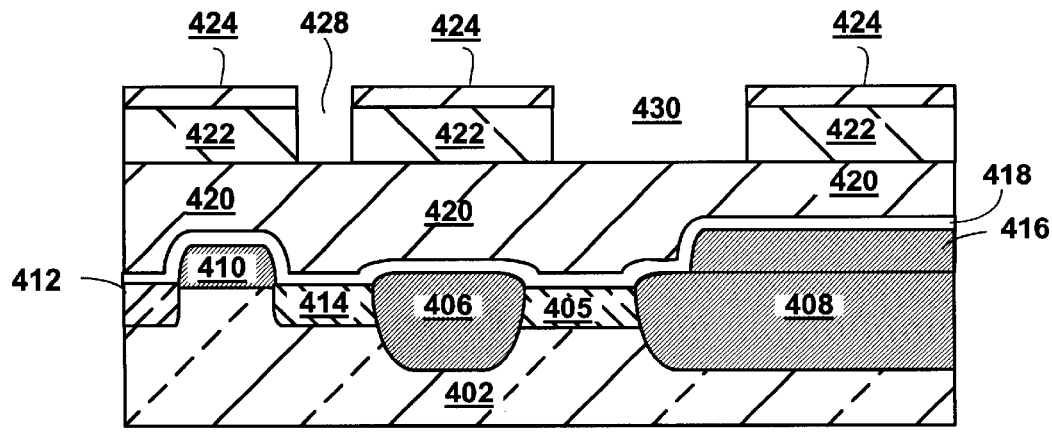

Referring now to FIG. 4C, therein is shown the etching of contact opening 428 and LI opening 430 in the BARC 422 following the LI mask pattern of the thin photoresist layer 424. The BARC 422 now acts as a hard mask. Because of thinness of the thin photoresist layer 424, it is almost entirely removed as a result of the etching process.

Figure 4D:
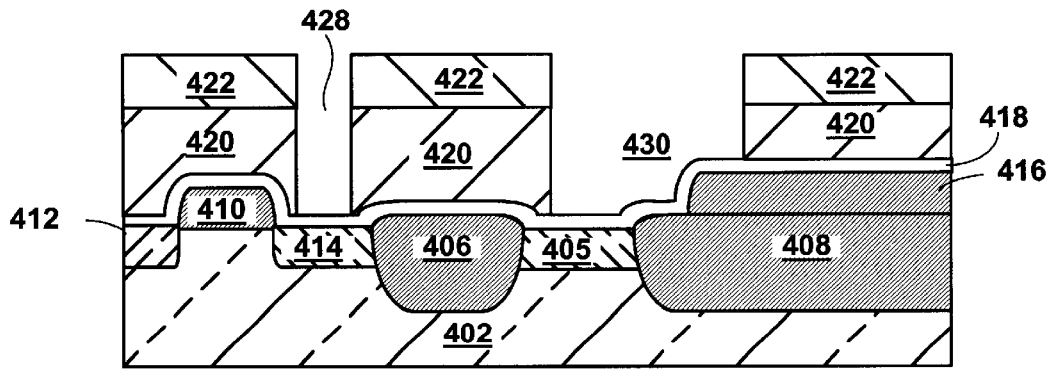

Referring now to FIG. 4D, therein is shown the deepening of the contact opening 428 and the LI opening 430 in the dielectric layer 420 by using the BARC 422 as a hard mask in conjunction with a conventional dielectric etch technique. The etch-stop layer 418 stops the etching process. The remainder of the thin photoresist layer 424 is removed as well as a portion of the BARC 422 as a result of the etching process.

Figure 4E:
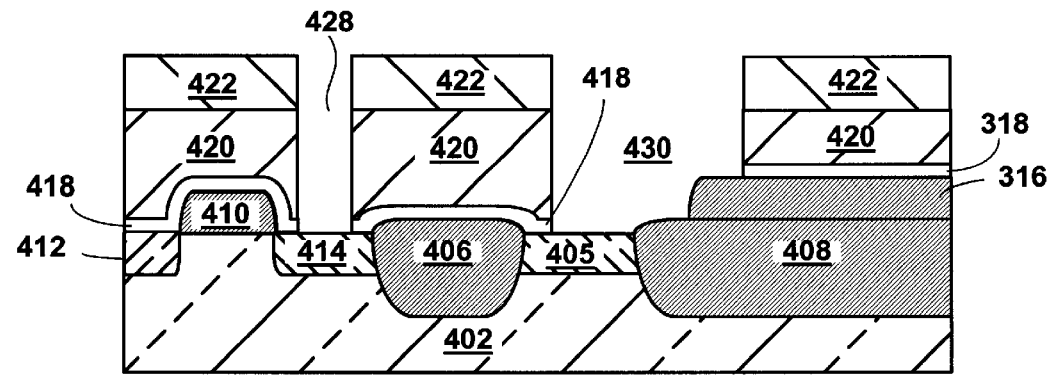

Referring now to FIG. 4E, therein is shown the deepening of the contact opening 428 and the LI opening 430 by removing the exposed etch-stop layer 418 using a conventional etch technique, such as a nitride etch.

Figure 4F:
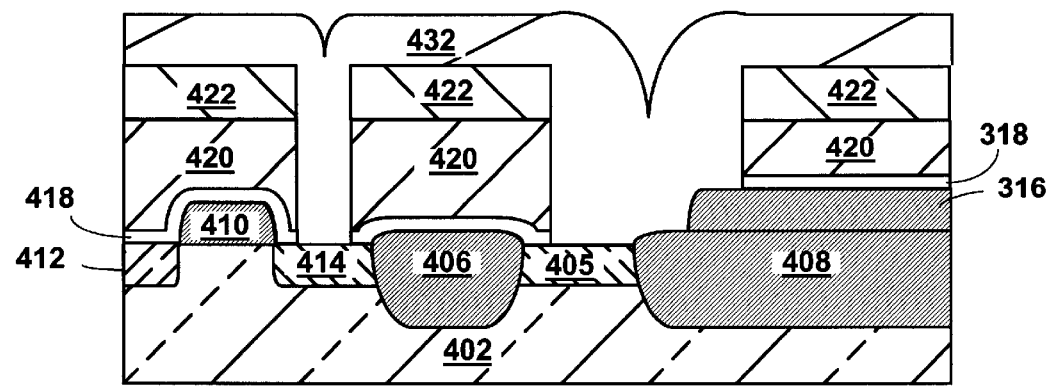

Referring now to FIG. 4F, therein is shown the deposition of conductive material 432 which conformally fills the contact opening 428 and the LI opening 430.

Figure 4G:
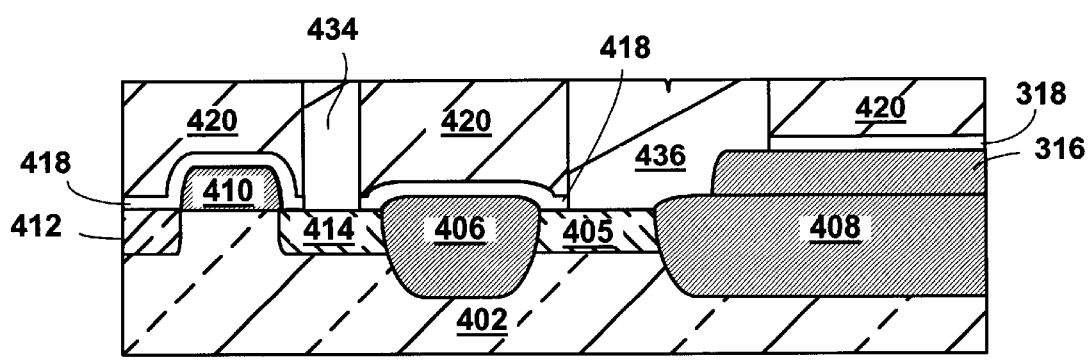

Referring now to FIG. 4G, therein is shown contact 434 and LI channel 436, which are formed after conductive material CMP. Since the BARC 422 is comparatively thin, the conductive material CMP also removes the BARC 422 without requiring a further second dielectric etch.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor comprising the steps of:
   providing a substrate of a semiconductor material;
   depositing an etch-stop layer on the semiconductor substrate;
   depositing a first dielectric layer on the etch-stop layer;
   depositing a second dielectric layer on top of the first dielectric layer, the second dielectric layer enriched with semiconductor material to increase the extinction coefficient thereof;
   depositing a photoresist on the second dielectric layer;
   patterning the photoresist;
   photolithographically processing the photoresist at the processing wavelength;
   developing the photoresist;
   etching the second dielectric layer using the developed photoresist;
   etching the first dielectric layer using the second dielectric layer;
   etching the etch-stop layer using the second dielectric layer whereby the photoresist is also etched away;
   depositing conductive material over the second and the first dielectric layers; and
   removing the conductive material and the second dielectric layer down to the first dielectric layer.

2. The method for manufacturing a semiconductor as claimed in claim 1 wherein the extinction coefficient of the second dielectric layer is a high extinction coefficient selected for the wavelength of light used for photolithographically processing the photoresist.

3. The method for manufacturing a semiconductor as claimed in claim 1 wherein the step of depositing the second dielectric layer deposits a second dielectric layer having a thickness less than the thickness of the first dielectric layer.

4. The method for manufacturing a semiconductor as claimed in claim I wherein the step of depositing the second dielectric layer deposits a second dielectric layer having a thickness below 400 Å.

5. The method of manufacturing a semiconductor as claimed in claim 1 wherein the step of depositing the second dielectric layer deposits a second dielectric layer having a thickness of between 300 to 400 Å.

6. The method of manufacturing a semiconductor as claimed in claim 1 wherein the step of depositing the second dielectric layer deposits the second dielectric layer using plasma enhanced chemical vapor deposition.

7. The method of manufacturing a semiconductor as claimed in claim 1 wherein the step of depositing the second dielectric layer deposits the second dielectric layer using plasma enhanced chemical vapor deposition modified to enrich the second dielectric layer with the same material as the semiconductor substrate.

8. A method of manufacturing a semiconductor comprising the steps of:

provinding a silicon substrate;

providing a plurality of semiconductor devices on and in the silicon substrate;

depositing a nitride over the plurality of semiconductor devices;

depositing silicon oxide on the nitride layer;

depositing silicon oxynitride on the silicon oxide, the silicon oxynitride enriched with silicon to increase the extinction coefficient thereof;

depositing a photoresist on the silicon oxynitride;

patterning the photoresist with a pattern of openings;

photolithographically processing the photoresist;

developing the photoresist;

etching the silicon oxynitride in the pattern of openings using the developed photoresist as a mask;

etching the silicon oxide in the pattern of openings using the silicon oxynitride as a mask whereby the photoresist is also etched away;

depositing conductive material over the silicon oxynitride and the silicon oxide; and removing the conductive material and the silicon oxynitride down to the silicon oxide.

9. The method for manufacturing a semiconductor as claimed in claim 8 wherein the extinction coefficient of the silicon oxynitride is greater than 2.0 for the wavelength of light used for photolithographically processing the photoresist and the thickness of the silicon oxynitride is less than 400 Å.

10. The method for manufacturing a semiconductor as claimed in claim 8 wherein the extinction coefficient of the silicon oxynitride is greater than $K=-1.1$ for the wavelength of light used for photolithographically processing the photoresist and the thickness of the silicon oxynitride is between 300 to 400 Å.

11. The method for manufacturing a semiconductor as claimed in claim 8 wherein the step of depositing the silicon oxynitride deposits a silicon oxynitride having a thickness less than the thickness of the silicon oxide.

12. The method of manufacturing a semiconductor as claimed in claim 8 wherein the step of depositing the silicon oxynitride deposits a silicon oxynitride between 300 to 400 Å thick.

13. The method of manufacturing a semiconductor as claimed in claim 8 wherein the step of depositing the silicon oxynitride deposits the silicon oxynitride using plasma enhanced chemical vapor deposition.

14. The method of manufacturing a semiconductor as claimed in claim 8 wherein the step of depositing the silicon oxynitride deposits the silicon oxynitride using plasma enhanced chemical vapor deposition modified to enrich the silicon oxynitride with silicon.

\* \* \* \* \*